(12) United States Patent
Yamashita et al.

(10) Patent No.: US 10,847,693 B2
(45) Date of Patent: Nov. 24, 2020

(54) LIGHT EMITTING DEVICE AND LEAD FRAME WITH RESIN

(71) Applicant: NICHIA CORPORATION, Anan (JP)

(72) Inventors: Ryohei Yamashita, Tokushima (JP);
Seitaro Akagawa, Komatsushima (JP);
Toshiyuki Hashimoto, Anan (JP);
Kazuki Koda, Anan (JP); Kiyoshi Kayama, Anan (JP); Yuta Horikawa, Anan (JP); Ryosuke Wakaki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 7 days.

(21) Appl. No.: 16/019,408

(22) Filed: Jun. 26, 2018

(65) Prior Publication Data

US 2018/0375004 A1    Dec. 27, 2018

(30) Foreign Application Priority Data

Jun. 27, 2017   (JP) .................................. 2017-125684

(51) Int. Cl.
*H01L 29/22*     (2006.01)
*H01L 33/62*     (2010.01)
(Continued)

(52) U.S. Cl.
CPC ............ *H01L 33/62* (2013.01); *H01L 23/562* (2013.01); *H01L 24/48* (2013.01); *H01L 25/167* (2013.01);
(Continued)

(58) Field of Classification Search
CPC ....... H01L 33/62; H01L 23/562; H01L 24/48; H01L 25/167; H01L 29/866;
(Continued)

(56) References Cited

U.S. PATENT DOCUMENTS

| 7,982,709 | B2 * | 7/2011 | Sekiguchi | ......... | G02F 1/133603 |
| | | | | | 345/102 |
| 2012/0080674 | A1 * | 4/2012 | Shimizu | .................. | H01L 24/97 |
| | | | | | 257/48 |

(Continued)

FOREIGN PATENT DOCUMENTS

| JP | S63159859 U | 10/1988 |
| JP | 2007288198 A | 11/2007 |

(Continued)

*Primary Examiner* — Nitin Parekh
(74) *Attorney, Agent, or Firm* — Hunton Andrews Kurth LLP

(57) ABSTRACT

A light emitting device includes a resin package having a rectangular shape in a top view and two short-side lateral surfaces and two long-side lateral surfaces. The two short-side lateral surfaces include a first external surface and a second external surface located on an opposite side from the first external surface. The two long-side lateral surfaces include a third external surface and a fourth external lateral surface located on an opposite side from the third external lateral surface. The lead is not exposed on the third external lateral surface nor the fourth external lateral surface. The first lead is exposed at the first external lateral surface and the second external lateral surface, respectively flush with the resin member at the first external lateral surface and the second external lateral surface. The second lead is exposed at the second external lateral surface, flush with the resin part at the second external lateral surface.

18 Claims, 9 Drawing Sheets

(51) Int. Cl.
*H01L 25/16* (2006.01)
*H01L 29/866* (2006.01)
*H01L 33/48* (2010.01)
*H01L 33/50* (2010.01)
*H01L 33/56* (2010.01)
*H01L 33/64* (2010.01)
*H01L 23/00* (2006.01)
*H01L 25/075* (2006.01)

(52) U.S. Cl.
CPC .......... *H01L 29/866* (2013.01); *H01L 33/486* (2013.01); *H01L 33/502* (2013.01); *H01L 33/56* (2013.01); *H01L 33/647* (2013.01); *H01L 25/0753* (2013.01); *H01L 2224/48137* (2013.01); *H01L 2224/48139* (2013.01); *H01L 2224/48245* (2013.01); *H01L 2224/48247* (2013.01); *H01L 2224/48257* (2013.01); *H01L 2224/49113* (2013.01); *H01L 2924/00014* (2013.01); *H01L 2924/12035* (2013.01); *H01L 2924/12041* (2013.01); *H01L 2924/30205* (2013.01); *H01L 2924/3511* (2013.01); *H01L 2933/0033* (2013.01); *H01L 2933/0091* (2013.01)

(58) Field of Classification Search
CPC ..... H01L 33/486; H01L 33/502; H01L 33/56; H01L 2224/48137
USPC .......................................................... 257/99
See application file for complete search history.

(56) References Cited

U.S. PATENT DOCUMENTS

| | | | |
|---|---|---|---|
| 2012/0127720 A1* | 5/2012 | Hussell | H01L 33/08 362/249.02 |
| 2012/0273826 A1 | 11/2012 | Yamamoto et al. | |
| 2012/0300491 A1* | 11/2012 | Hussell | H01L 24/49 362/602 |
| 2013/0070452 A1* | 3/2013 | Urano | H05K 1/181 362/231 |
| 2013/0214298 A1* | 8/2013 | Lin | H01L 33/60 257/88 |
| 2014/0043855 A1* | 2/2014 | Kang | G02B 6/009 362/612 |
| 2014/0183574 A1* | 7/2014 | Nakabayashi | H01L 23/495 257/88 |
| 2015/0129899 A1* | 5/2015 | Speer | H01L 27/15 257/88 |
| 2016/0027720 A1* | 1/2016 | Goto | H01L 23/4951 257/676 |

FOREIGN PATENT DOCUMENTS

| | | |
|---|---|---|
| JP | 2012182180 A | 9/2012 |
| JP | 2012234955 A | 11/2012 |
| JP | 2014022491 A | 2/2014 |
| JP | 2016021561 A | 2/2016 |
| JP | 5930893 B2 | 6/2016 |

* cited by examiner

LIGHT EMITTING DEVICE AND LEAD FRAME WITH RESIN

CROSS-REFERENCE TO RELATED PATENT APPLICATION

The present application claims priority under 35 U.S.C. § 119 to Japanese Patent Application No. 2017-125684 filed on Jun. 27, 2017, the contents of which are hereby incorporated by reference in their entirety.

BACKGROUND

Technical Field

The present disclosure relates to a light emitting device and a lead frame with resin.

Description of Related Art

A large-sized lead frame in which a plurality of pairs of lead parts are connected longitudinally and laterally by connecting portions, and light emitting devices manufactured with the use of the large-sized lead frame have been proposed, for example, in Japanese Unexamined Patent Application Publication No. 2014-022491. In manufacturing, a lead frame and a light-reflecting mold member are formed in one body, and the connecting portions that are located longitudinally and laterally are cut together with the molded member. Individual light emitting devices thus obtained have four external lateral surfaces each having the mold member and portions of the pair of the leads exposed from the mold member.

SUMMARY

The light emitting device described in Japanese Unexamined Patent Application Publication No. 2014-022491 has long sides and short sides in a top view. When such a light emitting device experiences bending stress applied in its height direction, the degree of warpage is generally greater at the long-side lateral surfaces than that at the short-side lateral surfaces. Accordingly, in the light emitting device having hard leads exposed at the long-side lateral surface as described in Japanese Unexamined Patent Application Publication No. 2014-022491, cracks may occur in the mold member near the leads.

Such disadvantage can be overcome as illustrated below.

The light emitting device according to certain embodiments of the present disclosure includes a resin package and one or more light emitting elements. The resin package includes a lead and a resin part configured to hold the lead. The lead includes a first lead and a second lead. The one or more light emitting elements are disposed on the lead. The resin package has a rectangular shape in a top view, and has two short-side lateral surfaces and two long-side lateral surfaces. The two short-side lateral surfaces include a first external surface and a second external surface that is located opposite side from the first external surface. The two long-side lateral surfaces include a third external surface and a fourth external lateral surface that is located opposite side from the third external lateral surface. The lead is not exposed on the third external lateral surface nor on the fourth external lateral surface. The first lead is exposed on the first external lateral surface and at the second external lateral surface, respectively flush with the resin part at the first external lateral surface and the second external lateral surface. The second lead is exposed at the second external lateral surface, flush with the resin part at the second external lateral surface.

The lead frame with resin according to certain embodiment of the present disclosure includes a lead frame including a plurality of lead portions and a resin part integrally holding the plurality of lead portions, and having a plurality of package portions each including one of the plurality of lead portions and a portion of the resin part hold the one of the plurality of lead portions. The resin part is integrally formed, connecting adjacent package portions. Each package portion has a rectangular shape having long sides and short sides. Each of the plurality of lead portions is connected to other portions of the lead frame only with the short sides.

With the light emitting device and the lead frame with resin, occurrence of crack in the resin part can be reduced.

DETAILED DESCRIPTION

A light emitting device and a lead frame with resin according to certain embodiments of the present disclosure will be described in detail below with reference to the drawings. The light emitting device and the lead frame with resin described below are intended as illustrative and the present disclosure is not limited to those embodiments described below. In the description below, terms which indicate specific directions or locations (for example, "up", "down" and other terms expressing those) may be applied. Those terms are used to express relative directional relationship and positional relationship between the components in a drawing which is referred to for the ease of understanding. The sizes and the arrangement relationship of the components in each of drawings are occasionally shown exaggerated for ease of understanding, and may not represent actual dimensions in the light emitting device and/or relationships between the sizes of the components in the actual light emitting device.

In the present specification, directions are referred to those of a corresponding drawing. For example, the term a "long-side direction" indicates a lateral direction (X-direction), which includes the right-direction (X-plus direction) and the left-direction (X-minus direction), and the term a "short-side direction" indicates a longitudinal direction (Y-direction), which includes the upward-direction (Y-plus direction) and the downward direction (Y-minus direction), respectively in a drawing which is referred to.

In the embodiments described below, the terms "package portion" and "lead frame with resin" may be appropriately used both before and after disposing a light emitting element and/or a wire, and/or other components. Also, same terms such as "resin part" may be appropriately used both before and after singulating.

Light Emitting Device According to First Embodiment

Light Emitting Device 100

Figure 1A:
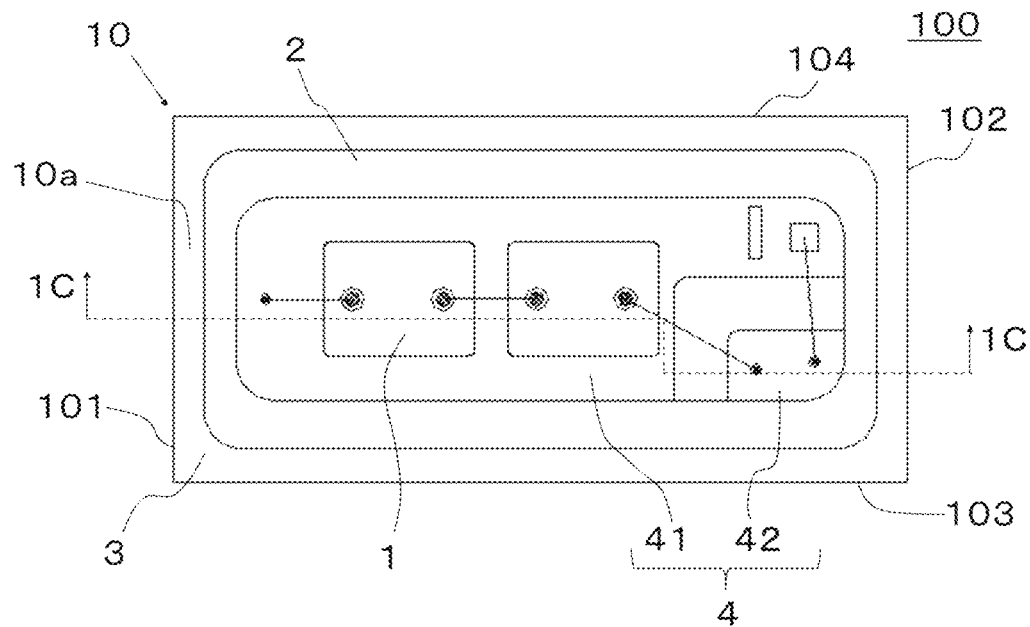
FIG. 1A is a schematic top view of a light emitting device according to a first embodiment according to the present disclosure, as seen from an upper surface side.
Figure 1B:
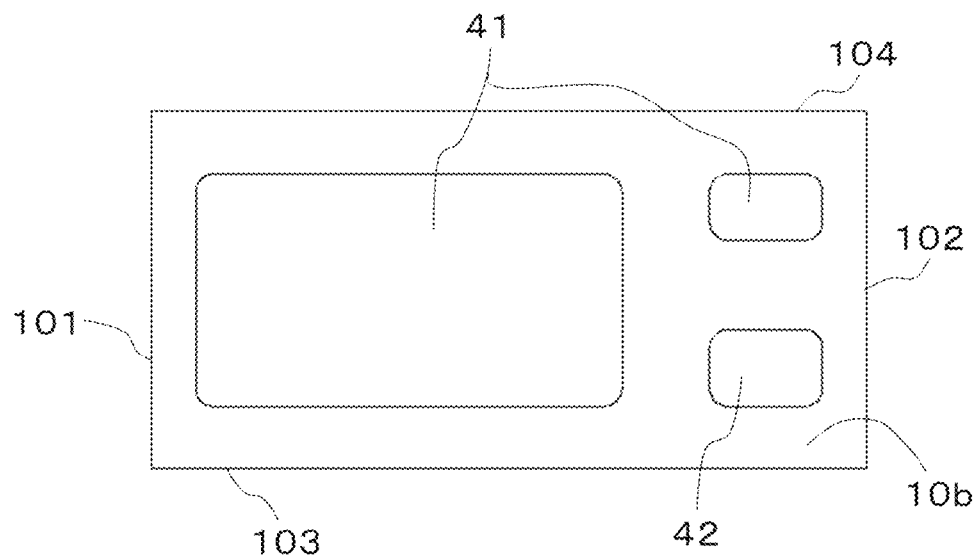
FIG. 1B is a schematic bottom view of the light emitting device according to the first embodiment according to the present disclosure, as seen from a lower surface side.
Figure 1C:
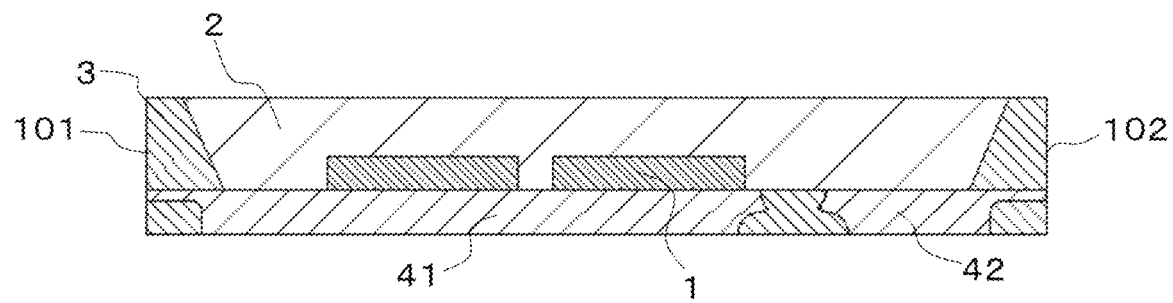
FIG. 1C is a schematic end surface view taken along line 1C-1C of FIG. 1A.
Figure 1D:
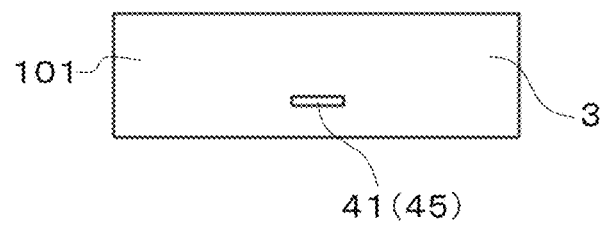
FIG. 1D is a schematic side view of the light emitting device according to the first embodiment according to the present disclosure, as seen from a first external lateral surface side.
Figure 1E:
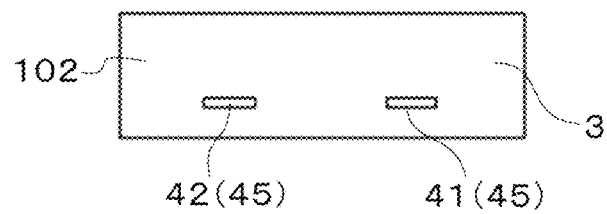
FIG. 1E is a schematic side view of the light emitting device according to the first embodiment according to the present disclosure, as seen from a second external lateral surface side.
Figure 1F:
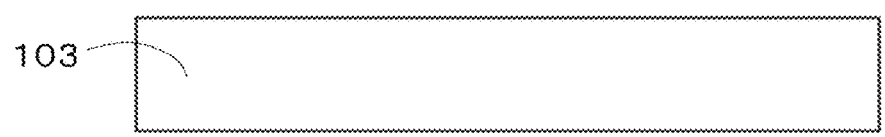
FIG. 1F is a schematic side view of the light emitting device according to the first embodiment according to the present disclosure, as seen from a third external lateral surface side.
Figure 1G:
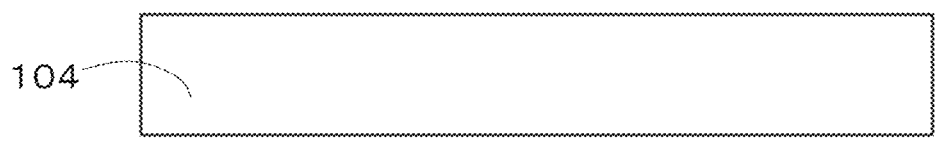
FIG. 1G is a schematic side view of the light emitting device according to the first embodiment according to the present disclosure, as seen from a fourth external lateral surface side.

A light emitting device 100 according to a first embodiment of the present disclosure will be described. FIG. 1A is a schematic top view, seen from an upper surface side of a light emitting device 100, FIG. 1B is a schematic bottom view, seen from a bottom surface side of the light emitting device 100, and FIG. 1C is a schematic end surface view taken along line 1C-1C of FIG. 1A. FIG. 1D is a schematic side view, seen from a first external lateral surface 101—side of the light emitting device 100, FIG. 1E is a schematic side view, seen from a second external lateral surface 102—side of the light emitting device 100, FIG. 1F is a schematic side view, seen from a third external lateral surface 103—side of the light emitting device 100, and FIG. 1G is a schematic side view, seen from a fourth external lateral surface 104—side of the light emitting device 100.

As shown in FIG. 1A, the light emitting device 100 according to the first embodiment includes a resin package 10 having a lead 4 and a resin part 3, and one or more light emitting elements 1 disposed on the lead 4. The resin package 10 has a rectangular shape when in a top view and has two short-side lateral surfaces and two long-side lateral surfaces. The lead 4 is not exposed at the long-side lateral surfaces of the resin package 10.

The components of the light emitting device body 100 will be described in detail below.

Resin Package 10

The resin package 10 serves as a mounting member of the light emitting elements 1. The resin package 10 includes a lead 4 that includes a first lead 41 and a second lead 42, and a resin part 3 that holds the lead 4. The resin package 10 shown in FIG. 1A has a recess 2 in the upper surface. Portions of the lead 4 are located at the bottom surface of the recess 2 and the light emitting elements 1 are placed on the first lead 41 of the lead 4.

The resin package 10 has a rectangular shape in a top view and having two short-side lateral surfaces and two long-side lateral surfaces. In the resin package 10 shown in FIG. 1A, the short-side lateral surfaces include a first external lateral surface 101 and a second external lateral surface 102 located opposite side from the first external lateral surface 101. The long-side lateral surfaces include a third external lateral surface 103 and a fourth external lateral surface 104 located opposite side from the third external lateral surface 103. The resin package 10 has an upper surface 10a and a lower surface 10b located opposite side from the upper surface 10a. At the lower surface 10b of the resin package 10, a lower surface of the first lead 41 and a lower surface of the second lead 42 are exposed from the resin part 3.

The resin package 10 has long-side lateral surfaces and short-side lateral surfaces in which, for example, one or more lateral surfaces among the long-side lateral surfaces and the short-side lateral surfaces may be inclined. In a top view, the resin package 10 may have an anode mark or a cathode mark that is formed by rounding a corner of the opening of the recess. The anode mark or the cathode mark serves as a mark indicating a polarity of the lead 4.

Lead 4, First Lead 41, Second Lead 42

The lead 4 including the first lead 41 and the second lead 42 has electrically conducting property and serves as electrodes to supply electricity to the light emitting elements 1. As in a third embodiment to be described further below, the lead 4 may include a third lead 43 in addition to the first lead 41 and the second lead 42. The third lead 43 may serve as a heat dissipating member, or may serve as an electrode like the first lead 41 and the second lead 42.

Figure 2A:
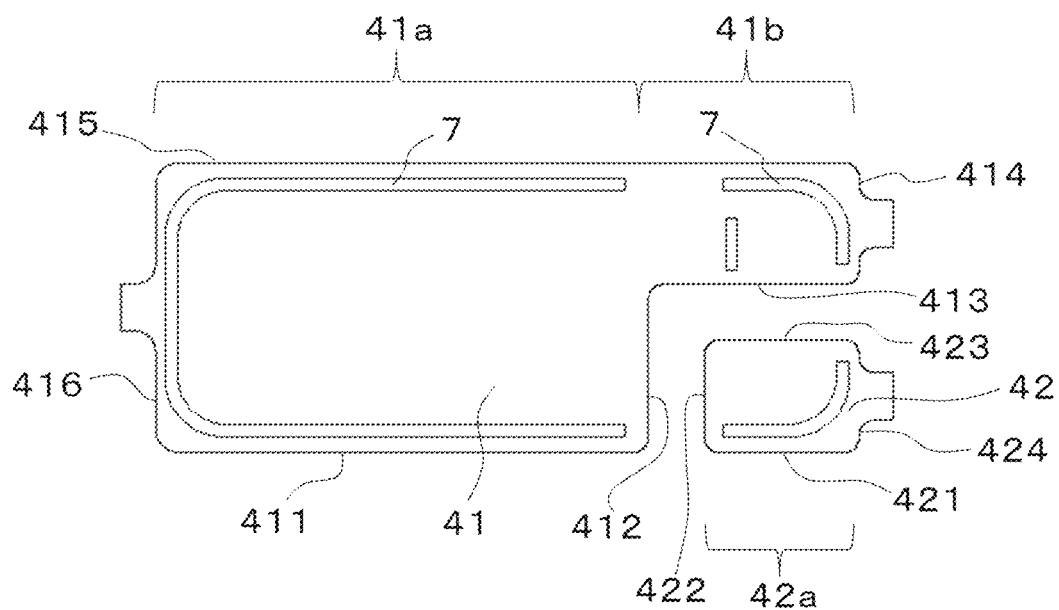
FIG. 2A is a schematic top view showing a shape of a lead of a light emitting device according to the first embodiment according to the present disclosure.

FIG. 2A is a schematic top view showing a shape of the lead 4 of the light emitting device 100, and FIG. 1B is a schematic bottom view showing a shape of the lead 4. The first lead 41 shown in FIG. 2A has an approximately rectangular main portion 41a and an approximately rectangular narrow portion 41b extending from the main portion 41a in the long-side direction. The width of the narrow portion 41b is smaller than the short-direction width of the main portion 41a. Meanwhile, the second lead 42 has an approximately rectangular main portion 42a in a top view, and placed facing a portion of the main portion 41a and a portion of the narrow portion 41b of the first lead 41.

More specifically, the first lead 41 has a first lateral side 411, a second lateral side 412, a third lateral side 413, a fourth lateral side 414, a fifth lateral side 415, and a sixth lateral side 416. The second lead 42 has a first lateral side 421, a second lateral side 422, a third lateral side 423, and a fourth lateral side 424. The first lateral side 411 of the first lead 41 and the first lateral side 421 of the second lead 42 are located facing the third external lateral surface 103 of the resin package 10. The fourth lateral side 414 of the first lead 41 and the fourth lateral side 424 of the second lead 42 are located facing the second external lateral surface 102 of the resin package 10. The fifth lateral side 415 of the first lead 41 is located facing the fourth external lateral surface 104 of the resin package 10. The sixth lateral side 416 of the first lead 41 is located facing the first external lateral surface 101 of the resin package 10.

The first lead 41 is extended from the first external lateral surface 101 of the resin package 10 along the long-side direction to reach the second external lateral surface 102 of the resin package 10, or is extended from the second external lateral surface 102 of the resin package 10 along the long-side direction to reach the first external lateral surface 101 of the resin package 10. The first lead 41 is extended in the entire long-side direction of the resin package 10, thus, when a bending stress is experienced in the height direction, the amount of warpage at the long-side lateral surface can be reduced. Accordingly, the strength of the resin package 10 can be improved.

It is preferable that, in a top view, the first lateral side 411 of the first lead 41 and the first lateral side 421 of the second lead 42 are located in a same plane, or the first lateral side 421 of the second lead 42 is located inward of the first lateral side 411 of the first lead 41. It is also preferable that, in a top view, the fourth lateral side 414 of the first lead 41 and the fourth lateral side 424 of the second lead 42 are located in a same plane, or the fourth lateral side 424 of the second lead 42 is located inward of the fourth lateral side 414 of the first lead 41. With this arrangement, the largest widths of the first lead 41 in the long-side direction and the short-side direction are also the largest widths of the lead 4 in the long-side direction and the short-side direction, respectively. Thus, reduction in the size of the light emitting device becomes possible.

Figure 2B:
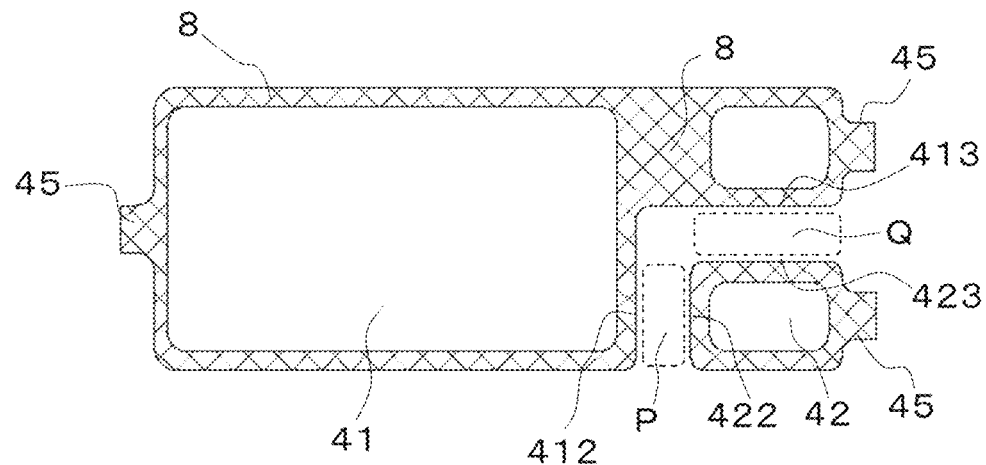
FIG. 2B is a schematic bottom view of the lead of the light emitting device according to the first embodiment according to the present disclosure.

In FIG. 2B, the second lateral side 422 of the second lead 42 is spaced apart from the second lateral side 412 of the first lead 41 via a spacing region P. Also, the third lateral side 423 of the second lead 42 is spaced apart from the third lateral side 413 of the first lead 41 via a spacing region Q. Portions of the resin part 3 are located at the spacing region P and the spacing region Q, respectively. Generally, the resin part made of a resin material has lower strength than the lead made of a metal member. Thus, when a stress is concentrated near the spacing region P and/or the spacing region Q, cracks may occur in the resin part 3 located below the spacing region P and/or the spacing region Q. However, in the light emitting device 100 according to the present disclosure, a portion of the lead 4 is arranged on an imaginary extension line of each of the spacing region P and the spacing region Q. Accordingly, for example, even when a bending stress is experienced near the spacing region P and/or the spacing region Q, the portion of the lead 4 on the imaginary extension line of each of the spacing regions can withstand the stress. Accordingly, the strength of the entire resin package 10 can be improved.

Each of the main portions 41a, 42a, and the narrow portion 41b may have an extended portion 45 that reaches the first external lateral surface 101 or the second external lateral surface 102. In a top view, the extended portions 45 are the portions narrower than the corresponding portions of the main portions 41a, 42a, and the narrow portion 41b, respectively. In the lead 4 shown in FIG. 2B, the extended portions 45 are provided near the center of the fourth lateral side 414 and the sixth lateral side 416 of the first lead 41 and the fourth lateral side 424 of the second lead 42, respectively. The extended portions 45 are portions of the first lead 41 and the second lead 42 respectively. The narrow extended portions 45 increase the respective contact areas of the first lead 41 and the second lead 42 with the resin part 3 and thus tight contact between the lead 4 and the resin part 3 can be increased. Further, when the first external lateral surface 101 and the second external lateral surface 102 is formed by cutting in the lead frame with resin 5, cutting can be performed at the narrow extended portions 45 and thus stress exerted by cutting can be reduced.

The lead 4 may have a recessed trough 7 in its upper surface. In the lead 4 shown in FIG. 2A, recessed troughs 7 are formed in the upper surfaces of the main portion 41a and the narrow portion 41b of the first lead 41 and in the upper surface of the main portion 41a of the second lead 42. A portion of the resin part 3 is placed in each of the recessed troughs 7. With the recessed trough(s) 7 formed in the upper surface of the lead 4, bonding strength between the resin part 3 and the lead 4 can be improved. A single recessed trough 7 may be formed in a single lead, or as shown in FIG. 2A, two or more recessed troughs 7 separated by a flat region may be formed in a single lead.

As shown in FIG. 2B, a lower surface side of each of the first lead 41 and the second lead 42 may be provided with a peripheral depression 8 (indicated by mesh hatching in FIG. 2B) along the lateral surfaces. The peripheral depressions 8 are recessed from the lower surface side toward the upper surface side. In FIG. 2B, the peripheral depressions 8 are formed along the first lateral side 411, the fourth lateral side 414, the fifth lateral side 415, and the sixth lateral side 416 of the first lead 41 and along the first lateral side 421 and the fourth lateral side 424 of the second lead 42, respectively.

The first lead 41 may be provided with a peripheral depression 8 between the lower surface of the main portion 41a and the lower surface of the narrow portion 41b. With the peripheral depression 8 that separates the lower surface of the main portion 41a and the lower surface of the narrow portion 41b, bonding of the resin part 3 and the lead 4 can be improved. At the time of mounting the light emitting device 100 on a mounting substrate with the use of a bonding member, uneven distribution of the bonding member that is wet-spreading on the surface may result when the lead 41 has an asymmetrical external shape as shown in FIG. 2B. However, in the light emitting device 100, the peripheral depression 8 is formed between the lower surface of the main portion 41a and the lower surface of the narrow portion 41b, which allows for forming a symmetrical shape such as a rectangular shape of the first lead 41 exposed at the lower surface of the resin package 10. Accordingly, uneven distribution of the bonding member that is wet-spreading on the surface of the first lead 41 can be reduced.

The peripheral depression 8 can be formed by etching or pressing.

In the light emitting device 100 having a rectangular shape in a top view, the extending portion 45 of the first lead 41 on the first external lateral surface 101 is preferably located on an imaginary straight line passing the center of the light emitting device 100 and extending in the long-side direction. With this configuration, even when the light emitting device 100 experiences a bending stress, the stress can be reduced in the vicinity of the extending portion 45.

As shown in FIG. 1D and FIG. 1E, the extending portion 45 is exposed on the first external lateral surface 101 or the second external lateral surface 102, and also approximately flush with the resin part 3 on the first external lateral surface 101 or the second external lateral surface 102. This configuration is obtained by cutting the lead frame with resin 5 at locations corresponding to the short-side lateral surface side (the first external lateral surface 101 and the second external lateral surface 102) of the regions to produce each resin package 10. That is, when the lead frame with resin 5 is cut at predetermined locations to create the first external lateral surface 101 and the second external lateral surface 102, the resin part 3 and the extending portion 45 at the predetermined locations are cut together, thus the surfaces where the resin part 3 and the extending portion 45 are flush with each other are created.

In the light emitting device 100 shown in FIGS. 1D and 1E, in the height direction, the lower surface of the first lead 41 on the first external lateral surface 101, the lower surface of the first lead 41 on the second external lateral surface 102, and the lower surface of the second lead 42 on the second external lateral surface 102 are preferably located spaced apart from the lower surface of the resin package 10. With this configuration, at the time of mounting the light emitting device 100 on a mounting substrate via a bonding member, portions of the bonding member rising up onto the first external lateral surface 101 and the second external lateral surface 102 can be prevented from entering the interfaces such as between the resin part 3 and the first lead 41.

Figure 3A:
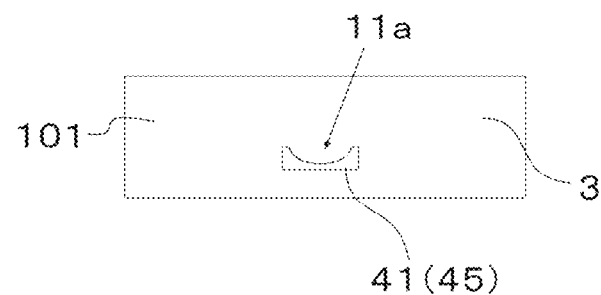
FIG. 3A is a schematic side view of a light emitting device according to the present disclosure, as seen from a third external lateral surface side.
Figure 3B:
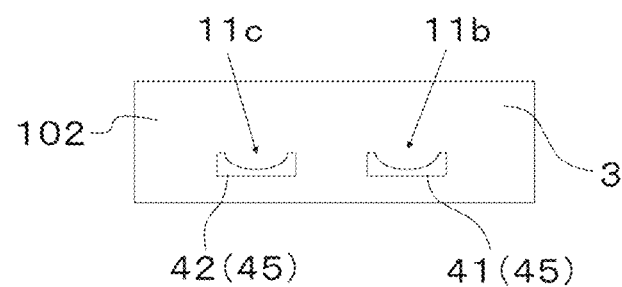
FIG. 3B is a schematic side view of a light emitting device according to the present disclosure, as seen from a fourth external lateral surface side.

FIG. 3A and FIG. 3B are schematic side views illustrating another example of a light emitting device 100 according to the present disclosure. As shown in FIG. 3A, on the first external lateral surface 101, the first lead 41 includes a first upward-opening recess 11a. Also, as shown in FIG. 3B, on the second external lateral surface 102, the first lead 41 includes a second upward-opening recess 11b and the second lead 42 includes a third upward-opening recess 11c. A portion of the resin part 3 is placed in each of the first upward-opening recess 11a, the second upward-opening recess 11b, and the third upward-opening recess 11c. More specifically, the first upward-opening recess 11a opens at the first external lateral surface 101 and recessed from the upper surface 10a side toward the lower surface 10b side of the resin package 10. The second upward-opening recess 11b and the third upward-opening recess 11c respectively open at the second external lateral surface 102 and recessed from the upper surface 10a side toward the lower surface 10b side of the resin package 10. The upper surface of the first lead 41 or/and the second lead 42 respectively located on the first external lateral surface 101 and the second external lateral surface 102 are respectively provided with an upward-opening recess and a portion of the resin part 3 is arranged in the upward-opening recess. Accordingly, bonding between the resin part 3 and the lead 4 can be improved.

Figure 4A:
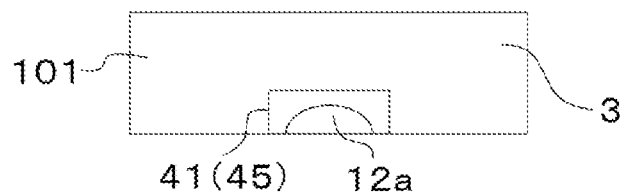
FIG. 4A is a schematic side view of a light emitting device according to the present disclosure, as seen from a third external lateral surface side.
Figure 4B:
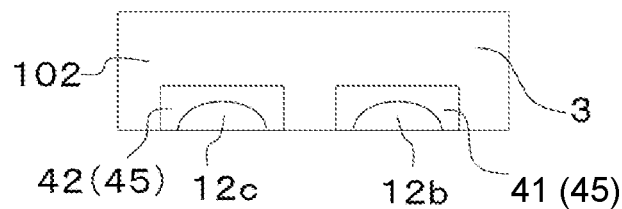
FIG. 4B is a schematic side view of a light emitting device according to the present disclosure, as seen from a fourth external lateral surface side.
Figure 4C:
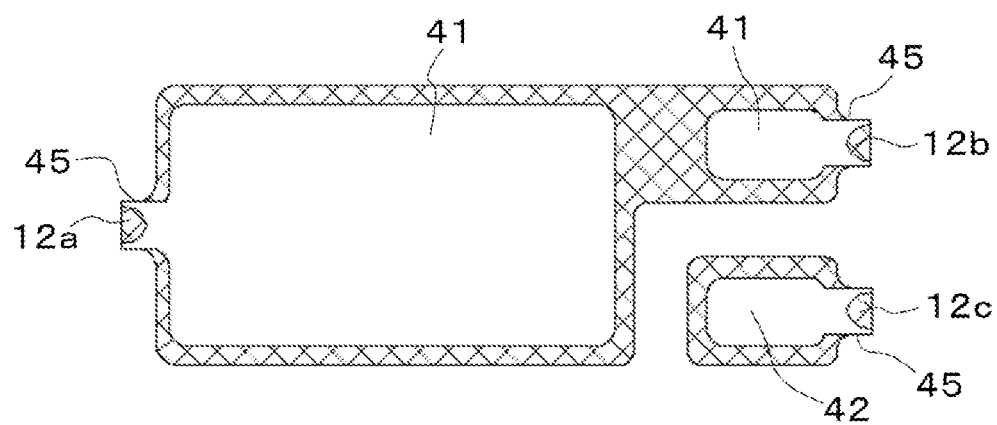
FIG. 4C is a schematic bottom view of a light emitting device according to the present disclosure.

FIG. 4A and FIG. 4B are schematic side views and FIG. 4C is a schematic bottom view respectively illustrating another example of the light emitting device 100. In FIG. 4A and FIG. 4B, the first lead 41 and the second lead 42 are shown exaggerated to illustrate the shapes thereof. In the light emitting device 100 shown in FIG. 4A and FIG. 4B, in the height direction, the lower surface of the first lead 41 on the first external lateral surface 101 and the lower surface of the first lead 41 and the lower surface of the second lead 42 on the second external lateral surface 102 are flush with the lower surface of the resin package 10. Accordingly, the exposing areas of the first lead 41 and the second lead 42 on the lower surface of the light emitting device 100 can be increased. Accordingly, at the time of bonding the light emitting device 100 on a mounting substrate via a bonding member, the bonding strength between the light emitting device 100 and the mounting substrate can be enhanced.

On the first external lateral surface 101, the first lead 41 may include a first downward-opening recess 12a. Similarly, on the second external lateral surface 102, the first lead 41 may include a second downward-opening recess 12b and the second lead 42 may include a third downward-opening recess 12c. As shown in FIG. 0.4C, the first downward-opening recess 12a opens at the lower surface of the resin package 10 and the first external lateral surface 101, and each of the downward-opening recesses 12a are recessed from the lower surface toward opposite surface of the lower surface of the resin package 10. The second downward-opening recess 12b opens both at the lower surface and the second external lateral surface 102 of the resin package 10 and is recessed from the lower surface toward opposite surface of the lower surface of the resin package 10.

Figure 5A:
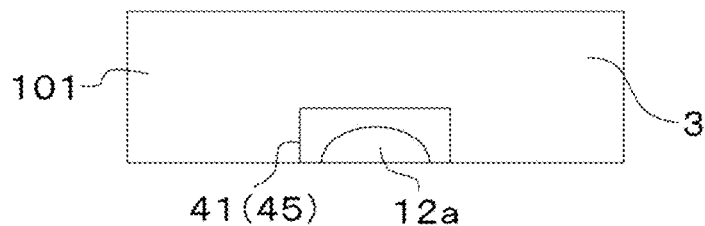
FIG. 5A is a schematic side view of a light emitting device according to the present disclosure, as seen from a third external lateral surface side.
Figure 5B:
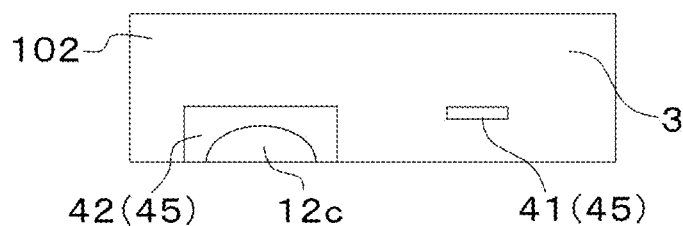
FIG. 5B is a schematic side view of a light emitting device according to the present disclosure, as seen from a fourth external lateral surface side.

FIG. 5A and FIG. 5B are schematic side views illustrating a further another example of the light emitting device 100. In the light emitting device 100 shown in FIG. 5A and FIG. 5B, in the height direction, the lower surface of the first lead 41 or the lower surface of the second lead 42 at the second external lateral surface 102 is located spaced apart from the lower surface of the resin package 10 and the other is located flush with the lower surface of the resin package 10. With this configuration, when the light emitting device 100 is mounted with the use of a bonding member, migration of the bonding member between the first lead 41 and the second lead 42 located on the second external lateral surface 102 that may result in electrical short-circuit in the light emitting device 100 can be reduced.

As shown in FIG. 1F and FIG. 1G, the lead 4 is not exposed at the third external lateral surface 103 and the fourth external lateral surface 104 that are long-side lateral surfaces. In other words, only the resin part 3 is present at the third external lateral surface 103 and the fourth external lateral surface 104 that are long-side lateral surfaces. With this configuration, the lead 4 is not exposed at the long-side lateral surfaces that may be easily bent by bending stress, and thus occurrence of cracks in the resin part 3 that are originated from the lead 4 can be reduced.

Each of the lead 4 includes a base member and a metal layer that covers the base member. The base member preferably has a plate-like shape. The base member may include a metal such as copper, aluminum, gold, silver, iron, nickel, or an alloy thereof, phosphor bronze, and iron copper. The base member may be made of a single layer or has a layered structure (for example, a cladding material). In particular, copper that is inexpensive and has high heat dissipation performance is preferably used for the base member. The metal layer may include, for example, silver, aluminum, nickel, palladium, rhodium, gold, silver, or an alloy thereof. The lead 4 may have a region absent of the metal layer. The metal layer disposed on the upper surface of the lead 4 and the metal layer disposed on the lower surface of the lead 4 may be different. For example, the metal layer disposed on the upper surface of the lead 4 may be a metal layer made of a plurality of layers including a metal layer of nickel, and the metal layer disposed on the lower surface pf the lead 4 may be a metal layer that does not contain a nickel layer.

In the case where a plated layer containing silver is disposed on the outermost surface of the lead 4, a protective layer of such as silicon oxide is preferably provided on the plated layer containing silver. With this arrangement, discoloration of the plated layer containing silver caused by sulfur in the air can be reduced. The protective layer can be disposed using a vacuum process such as sputtering, or using another known method.

Resin Part 3

For the resin part 3, a thermosetting resin, a thermoplastic resin, or the like can be used as a base resin material. Specific examples thereof include a cured product of an epoxy resin composition, a silicone resin composition, a modified epoxy resin composition such as a silicone-modified epoxy resin, an unsaturated polyester resin, a saturated polyester resin, a polyimide resin composition, a modified polyimide resin composition, a polyphthalamide (PPA), a polycarbonate resin, a polyphenylene sulfide (PPS), a liquid polymer (LCP), an ABS resin, a phenol resin, an acrylic resin, and a PBT resin. In particular, a thermosetting resin such as an epoxy resin composition or a modified silicone resin composition is preferably used.

In particular, examples of preferable resin material for the resin part 3 include a silicone resin compound (for example a SMC resin) having good heat-resisting and light-resisting properties.

The resin part 3 may have a low reflectance to external light (in many cases, sun light) to improve the contrast of the light emitting device. In this case, generally a black color or a color close to black is preferable. In this case, an appropriate filler material can be used according to intended usage. Examples thereof include carbon such as acetylene black, activated carbon, and graphite, a transmission metal oxide such as iron oxide, manganese dioxide, cobalt oxide, and molybdenum oxide, and a chromatic organic pigment.

Light Emitting Element 1

One or more light emitting elements 1 are disposed on the upper surface of the lead 4. For each of the light emitting elements 1, a light emitting diode element or the like can be employed. The light emitting element 1 particularly preferably include a nitride-based semiconductor ($In_xAl_yGa_{1-x-y}N$, $0 \leq x$, $0 \leq y$, $x+y \leq 1$) that can emit light in a range of ultraviolet to visible light. In the present embodiment, the light emitting device has two light emitting elements, but a single light emitting element or three or more light emitting elements can be employed. When the light emitting device has two light emitting elements, for example, a light emitting element to emit blue light and a light emitting element to emit green light may be employed. When the light emitting device has three light emitting elements, a light emitting element to emit blue light, a light emitting element to emit green light, and a light emitting element to emit red light may be employed.

In the light emitting device 100, a sealing member may be disposed in the recess 2. The sealing member covers the light emitting element 1 placed at the bottom of the recess 2, so that the light emitting element 1 can be protected from external force, dusts, moisture, or the like.

It is preferable that the sealing member can transmit 60% or greater, more preferably 90% or greater light emitted from the light emitting element 1. For the material of the sealing member, a resin material used for the resin part 3 can also be used. For the base resin material, a thermosetting resin, a thermoplastic resin, or the like can be used, and for example, a silicone resin, an epoxy resin, an acrylic resin, or a resin containing one or more of those can be used. The sealing member may be formed with a single layer or a plurality of layers. Further, light scattering particles of titanium oxide, silicon oxide, zirconium oxide, or/and aluminum oxide may be dispersed in the sealing member.

The sealing member may contain a material (such as a fluorescent material) that can convert the wavelength of light emitted from the light emitting element 1. Examples of the fluorescent material include yttrium aluminum garnet activated with cerium, lutetium aluminum garnet activated with cerium, nitrogen-containing calcium aluminosilicate (portion of calcium can be substituted with strontium) activated with europium and/or chromium, sialon activated with europium, silicate activated with europium, strontium aluminate activated with europium, and potassium fluosilicate activated with manganese.

The light scattering particles and/or the fluorescent material is preferably contained in a range of about 10 to about 100 weight % with respect to the total weight of the sealing member.

The light emitting device 100 may further include a protective element such as Zener diode. The protective element is mounted on the upper surface of the lead 4 at the bottom surface of the recess 2. When the first lead 41 has the main portion 41a and the narrow portion 41b, it is preferable that the light emitting element 1 is disposed on the main portion 41a and the protective element is disposed on the narrow portion 41b. With this arrangement, unintentional contact between the bonding member of the light emitting element 1 and the bonding member of the protective member can be prevented.

In the light emitting device 100 according to the first embodiment as described above, the lead 4 is not exposed at the long-side lateral surface side that may be easily bent by bending stress, so that occurrence of cracks in the resin part 3 that are originated from the lead 4 can be reduced.

Lead Frame with Resin 5

Figure 6A:
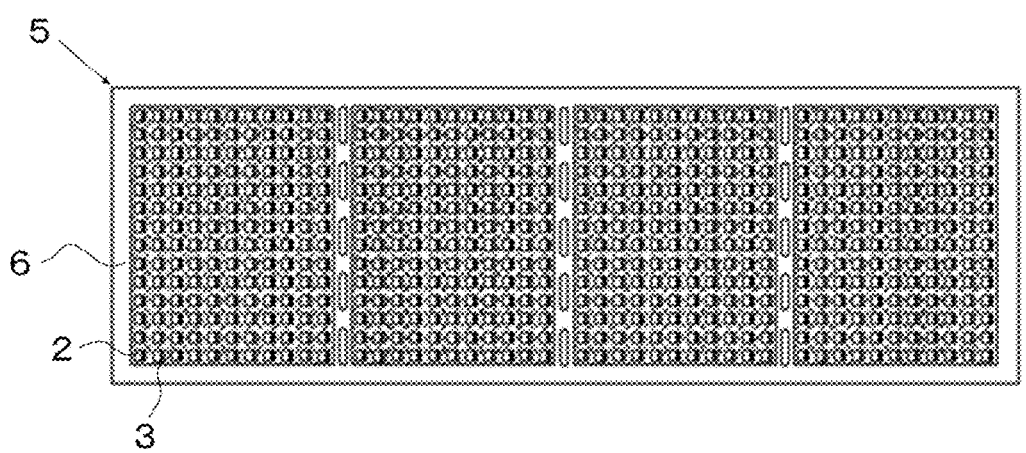
FIG. 6A is a schematic top view of a lead frame with resin according to the present disclosure, as seen from an upper surface side.
Figure 6B:
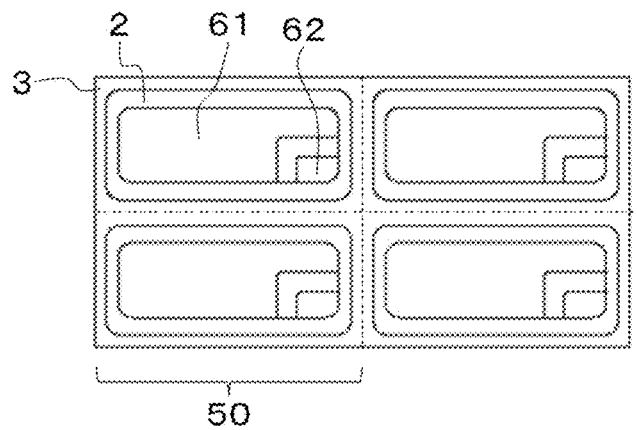
FIG. 6B is a schematic top view showing four package portions according to the present disclosure.

Next, the lead frame with resin 5 used in manufacturing the light emitting device 100 according to the first embodiment will be described. FIG. 6A is a schematic top view of a lead frame with resin 5 seen from above, FIG. 6B is a schematic top view showing four package portions 50, and FIG. 6C is a schematic top view showing a lead frame 6.

The lead frame with resin 5 includes a lead frame 6 and a resin part 3 formed in an integral manner with the lead frame 6. The lead frame with resin 5 defines a plurality of recesses 2 in its upper side. On the bottom surface of each of the recesses 2, a portion of the lead frame to be singulated to provide a first lead 41 (hereinafter to be referred to as "first lead portion 61") and a portion of the lead frame to be singluraled to provide a second lead 42 (hereinafter to be referred to as "second lead portion 62") are both located. The light emitting element(s) 1 and the sealing member are to be disposed in the recess 2.

The lead frame with resin 5 includes a plurality of package portions 50. In FIG. 6B, four package portions 50 are illustrated. Each of the package portions 50 is indicated by the region surrounded by the predetermined cutting lines (dotted lines) extending in the row direction and in the column direction in FIG. 6B. Each of the package portions 50 has a rectangular shape having long-sides and short-sides in a top view, and includes the first lead portion 61, the second lead portion 62, and a portion of the resin part 3. The resin part 3 is integrally formed connecting a single package portion 50 with its adjacent package portions 50. In FIG. 6B, the resin part 3 constituting an upper surface of a single package portion 50, the resin parts 3 constituting respective upper surfaces of other package portions 50, and the resin part 3 located in the vicinity of the predetermined cutting lines between two adjacent package portions 50 are flush with each other.

Figure 6C:
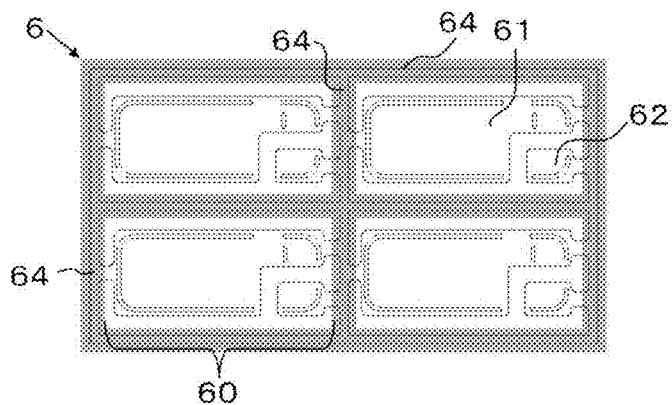
FIG. 6C is a schematic top view showing a lead frame according to the present disclosure.

Next in FIG. 6C, the lead frame 6 used in the lead frame with resin 5 is illustrated. The lead frame 6 includes a plurality of lead portions 60 and a plurality of supporting parts 64. Each of the lead portions 60 is a portion to be singulated to provide the lead 4.

The plurality of lead portions 60 are arranged in columns and rows in the lead frame 6. Each of the lead portion 60 includes the first lead portion 61 and the second lead portion 62 arranged in the row direction. Each of the first lead portions 61 reaches both the short sides of the package portion 50. As shown in FIG. 6C, the first lead portion 61 is connected to the supporting part 64 at one of the two short-sides of the package portion 50. The first lead portion 61 and the second lead portion 62 are connected to the supporting part 64 at the other of the two short-sides of the package portion 50. Meanwhile, the lead portion 60 and the supporting part 64 are not connected at the two long-sides of the package portion 50.

When the resin frame with resin 5 is singulated, the lead frame 6 is cut along the supporting part 64. In FIG. 6C, the predetermined cutting lines are indicated by shading. The supporting part 64 can be removed in singulating by, for example, using a blade of a dicing saw or the like, having a width greater than the width of the supporting part 64, such that the supporting part 64 does not remain in the singulated light emitting device 100.

The lead frame 6 and the resin part 3 are cut together in singulating the lead frame with resin 5 according to the present disclosure. More specifically, at the two short-sides of the package portion 50, the resin part 3, the supporting part 64, and a portion of the lead portion 60 are cut together. At the two long-sides of the package portion 50, the resin part 3 and the supporting part 64 are cut together. By such cutting, the resin part 3 and a portion of lead 4 exposed from the resin part 3 are located on the short-side lateral surfaces of the singulated resin package. Meanwhile, only the resin part 3 is present at the long-side lateral surfaces of the resin package 10.

Singulating the lead frame with resin 5 can be selected from various methods such as cutting with a lead-cutting mold, cutting with a dicing saw, and cutting with a laser light.

According to the lead frame with resin 5 described above, the lead portion 60 is not present at the two long-side lateral surfaces of the package portion. With this configuration, at the time of cutting the long-side of the package portion 50, occurrence of cracks originated from the lead portion 60 can be reduced. Further, absence of the lead portion 60 at the long-side lateral surfaces that create a large cutting area can reduce the total stress exerted on the lead portion 60. As a result, problems such as deformation of the lead portion 60 can be reduced.

Figure 7:
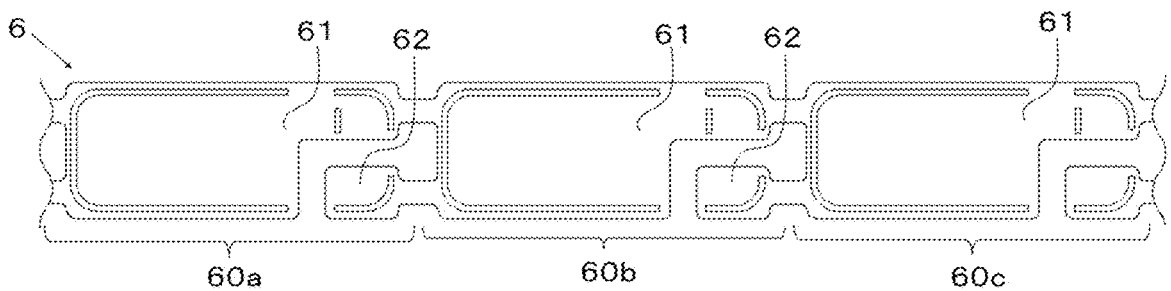
FIG. 7 is a schematic top view showing a modified example of a lead frame according to the present disclosure.

FIG. 7 is a schematic top view showing a modified example of the lead frame 6. The lead frame 6 shown in FIG. 7 differs from the lead frame shown in FIG. 6C in that a single lead portion 60 and adjacent lead portions are directly connected to each other in FIG. 7 without being connected through the supporting part 64. More specifically, the lead frame 6 shown in FIG. 7 has a first lead unit 60a, a second lead unit 60b, and a third lead unit 60c connected in this order in a row direction. At the left short-side of the second lead unit 60b, the first lead portion 61 of the second lead unit 60b is directly connected to the first lead portion 61 and the second lead portion 62 of the first lead unit 60a without being connected through other portions of the lead frame 6. Also, at the right short-side of the second lead unit 60b, the first lead portion 61 and the second lead portion 62 of the second lead unit 60b are directly connected to the first lead portion 61 of the third lead unit 60c without being connected through other portions of the lead frame 6.

In the lead frame 6 shown in FIG. 7, a single lead portion and its adjacent lead portions are directly connected to each other. With this configuration, for example, compared to the lead frame that to be singulated by cutting along the supporting part 64, stress exerted to the lead frame 6 while cutting can be reduced. As a result, deformation etc., of the lead frame can be reduced.

Light Emitting Device According to Second Embodiment

Figure 8A:
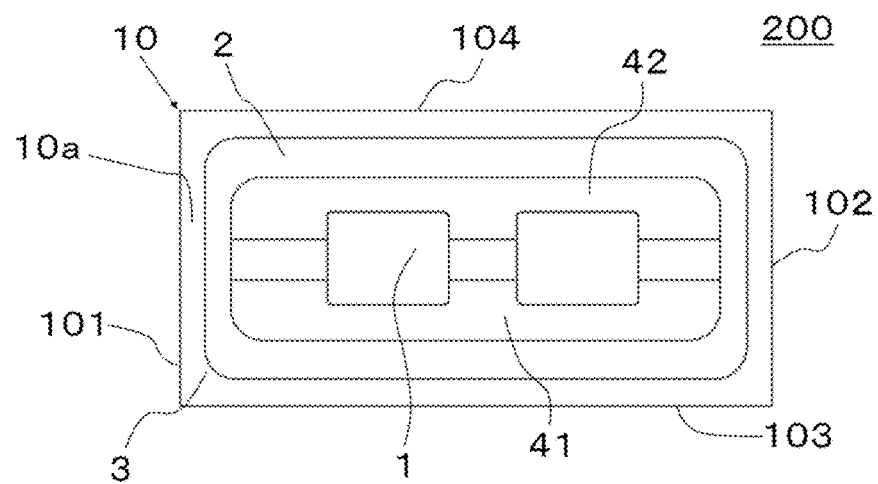
FIG. 8A is a schematic top view of a light emitting device according to a second embodiment according to the present disclosure, as seen from an upper surface side.
Figure 8B:
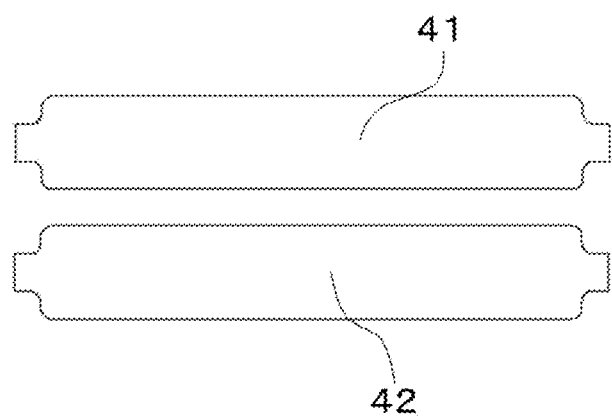
FIG. 8B is a schematic top view showing a shape of a lead of a light emitting device according to the second embodiment according to the present disclosure.

A light emitting device 200 according to a second embodiment will be described below. FIG. 8A is a schematic top view of a light emitting device 200 seen from above, and FIG. 8B is a schematic top view of a lead 4 of the light emitting device 200. The light emitting device 200 according to the second embodiment has a configuration similar to that of the light emitting device 100 according to the first embodiment, except that in the light emitting device 200, the second lead 42 is exposed at the first external lateral surface 101 and is also flush with the resin part 3 in the first external lateral surface 101.

The light emitting device 200 according to the second embodiment includes a resin package 10 having a first lead 41, a second lead 42, and the resin part 3, and one or more light emitting elements 1 mounted on the resin package 10. The resin package 10 has a rectangular shape in a top view and having two short-side lateral surfaces and two long-side lateral surfaces.

The first lead 41 and the second lead 42 are exposed at the first external lateral surface 101 and also are flush with the resin part 3 in the first external lateral surface 101. The first lead 41 and the second lead 42 are exposed at the second external lateral surface 102, and also are flush with the resin part 3 in the second external lateral surface 102. In other words, in a top view, both ends of the first lead 41 and the second lead 42 are respectively reach the first external lateral surface 101 and the second external lateral surface 102.

In the light emitting device 200 according to the second embodiment, in a top view, both ends of the first lead 41 and the second lead reach the first external lateral surface 101 and the second external lateral surface 102, respectively. With this configuration, even when the resin package 10 experiences a bending stress, deformation of the long-side lateral surface side of the resin package 10 can be reduced.

At the third external lateral surface 103 and the fourth external lateral surface 104, the first lead 41 and the second lead 42 are not exposed from the resin part 3. With this configuration, the lead 4 is not exposed at the long-side lateral surface side that may be easily bent by bending stress, so that occurrence of cracks in the resin part 3 that are originated from the lead 4 can be reduced.

Light Emitting Device According to Third Embodiment

Figure 9A:
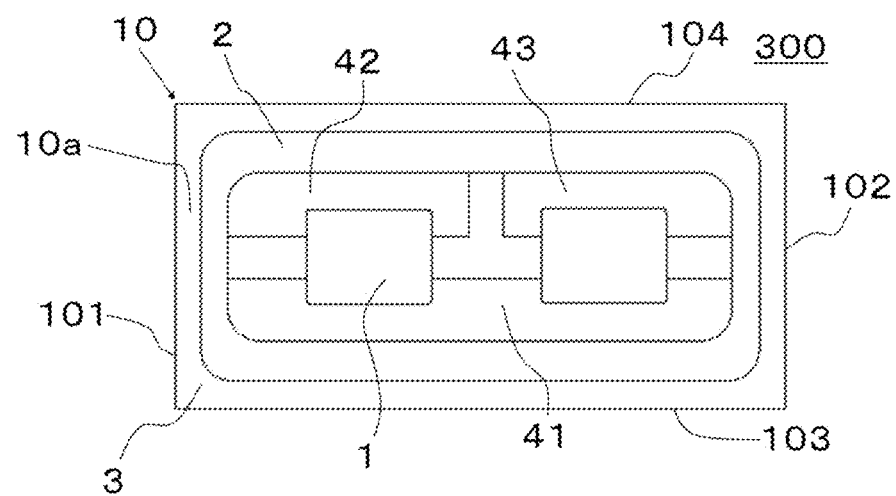
FIG. 9A is a schematic top view of a light emitting device according to a third embodiment according to the present disclosure, as seen from an upper surface side.
Figure 9B:
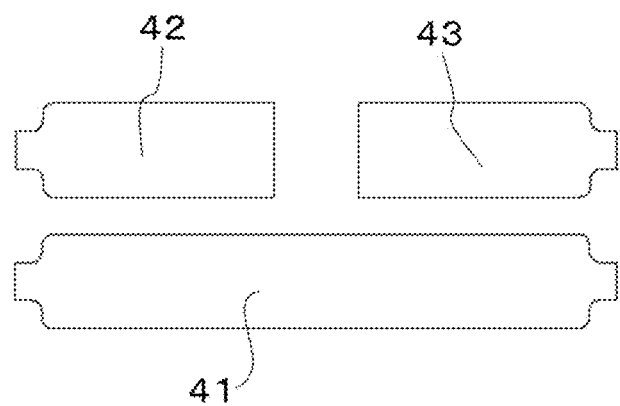
FIG. 9B is a schematic top view showing a shape of a lead of a light emitting device according to the third embodiment according to the present disclosure.

A light emitting device 300 according to a third embodiment will be described below. FIG. 9A is a schematic top view of a light emitting device 300, and FIG. 9B is a schematic top view showing a shape of a lead 4 of the light emitting device 300. The light emitting device 300 according to the third embodiment has a configuration similar to that of the light emitting device 100 according to the first embodiment, except that a third lead 43 is further provided in the light emitting device 300.

The light emitting device 300 according to the third embodiment includes a resin package 10 having a first lead 41, a second lead 42, a third lead 43, and a resin part 3, and one or more light emitting elements 1 mounted on the resin package 10.

In the short-side direction, the second lead 42 and the third lead 43 are disposed facing the first lead 41. In the long-side direction, the second lead 42 and the third lead 43 are disposed facing each other.

When the second lead 42 and the third lead 43 are disposed spaced apart from each other, stress tends to be experienced in the spacing region between the second lead 42 and the third lead 43, but in the light emitting device 300 according to the third embodiment, the first lead 41 is disposed facing the spacing region, which allows for an improvement in the mechanical strength of the light emitting device 300. At the third external lateral surface 103 and the fourth external lateral surface 104, the first lead 41, the second lead 42, and the third lead 43 are not exposed from the resin part 3. With this configuration, the lead 4 is not exposed at the long-side lateral surface side that may be easily bent by bending stress, so that occurrence of cracks in the resin part 3 that are originated from the lead 4 can be reduced.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
    a resin package and at least one light emitting element;
    the resin package comprising a lead and a resin part configured to hold the lead;
        the lead comprising a first lead and a second lead, and
        the at least one light emitting element being disposed on the lead;
    wherein the resin package has a rectangular shape in a top view, and has two short-side lateral surfaces and two long-side lateral surfaces;
        the two short-side lateral surfaces include a first external lateral surface and a second external lateral surface that is located on an opposite side from the first external surface;
        the two long-side lateral surfaces include a third external surface and a fourth external lateral surface that is located on an opposite side from the third external lateral surface;
        the lead is not exposed on the third external lateral surface nor the fourth external lateral surface;
        the first lead is exposed at the first external lateral surface and the second external lateral surface, respectively flush with the resin part at the first external lateral surface and the second external lateral surface; and
        the second lead is exposed at the second external lateral surface, flush with the resin part at the second external lateral surface,
    wherein the first lead is apart from the second lead, and wherein the first lead and the second lead are two distinct leads.

2. The light emitting device according to claim 1, wherein the resin package has a long-side direction extending from the first external lateral surface side toward the second external lateral surface side and a short-side direction extending from the third external lateral surface toward the fourth external lateral surface, and the first lead includes a main portion and a narrow portion extending from the main portion in the long-side direction with a width smaller than a width of the main portion in a top view.

3. The light emitting device according to claim 2, wherein the main portion and the narrow portion of the resin package respectively include an extending portion reaching the first external lateral surface and the second external lateral surface, and in the short-side direction, a width of the extending portions in the top view is narrower than a width of the main portion and a width of the narrow portion in the top view.

4. The light emitting device according to claim 2, wherein the second lead includes two lateral portions respectively facing the main portion or the narrow portion.

5. The light emitting device according to claim 1, wherein a lower surface of the first lead located on the first external lateral surface, a lower surface of the first lead located on the second external lateral surface, and a lower surface of the second lead located on the second external lateral surface are located higher than a lower surface of the resin package.

6. The light emitting device according to claim 1, wherein a lower surface of the first lead located at the first external lateral surface, a lower surface of the first lead located at the second external lateral surface, and a lower surface of the second lead located at the second external lateral surface are flush with a lower surface of the resin package.

7. The light emitting device according to claim 6, wherein the first lead is formed with a first downward-opening recess opening in the lower surface of the resin package and in the first external lateral surface, and recessing from the lower surface toward an upper surface side of the first lead, and a second downward-opening recess opening in the lower surface of the resin package and in the second external lateral surface, and recessing from the lower surface toward the upper surface side of the first lead; and the second lead is formed with a third downward-opening recess opening in the lower surface of the resin package and in the second external lateral surface, and recessing from the lower surface toward an upper surface side of the second lead.

8. The light emitting device according to claim 1, wherein one of a lower surface of the first lead and a lower surface of the second lead that are located at the second external lateral surface is located higher than a lower surface of the resin package, and the other one of the lower surface of the first lead and the lower surface of the second lead that are located at the second external lateral surface is flush with the lower surface of the resin package.

9. The light emitting device according to claim 1, wherein each portion of the first lead located at the first external lateral surface and the second external lateral surface includes a first upward-opening recess recessing from an upper surface toward a lower surface side of the first lead, and the second lead located at the second external lateral surface includes a second upward-opening recess recessing from an upper surface toward a lower surface side of the second lead, and a portion of the resin part is placed in the first upward-opening recess and in the second upward-opening recess, respectively.

10. The light emitting device according to claim 1, wherein the second lead is exposed at the first external lateral surface and is flush with the resin part at the first external lateral surface.

11. The light emitting device according to claim 1, wherein the lead further includes a third lead, the second lead and the third lead are disposed facing each other in a long-side direction, and the third lead is disposed facing the first lead in a short-side direction.

12. The light emitting device according to claim 1, wherein the resin package is formed with a recess, a portion of the lead is exposed on a bottom surface of the recess, and the one or more light emitting elements are mounted on respective portions of the lead exposed on the bottom surface of the recess.

13. The light emitting device of claim 1, wherein the lead comprising the first lead and the second lead has electrically conducting property and serves as electrodes to supply electricity to the at least one light emitting element.

14. The light emitting device of claim 1, wherein the second lead is not exposed at the first external lateral surface.

15. A lead frame with resin comprising:
a lead frame including a plurality of lead portions; and
a resin part integrally holding the plurality of lead portions; and
a plurality of package portions each including one of the plurality of lead portions and a portion of the resin part holding the one of the plurality of lead portions;
wherein the resin part is integrally formed connecting one of the plurality of package portions with adjacent ones of the plurality of package portions;
each of the plurality of package portions has a rectangular shape having long-sides and short-sides; and each of the plurality of lead portions is connected to other portions of the lead frame only with the short-sides, and
wherein each of the plurality of package portions includes a recess.

16. The lead frame according to claim 15, wherein each of the plurality of lead portions includes a first lead portion and a second lead portion, and in each of the package portions, the first lead portion reaches both the two short-sides.

17. The lead frame according to claim 16, wherein the lead frame includes a first lead unit, a second lead unit, and a third lead unit disposed in this order in a row direction, and at one of the two short-sides of the second lead unit, the first lead portion of the second lead unit is connected to the first lead portion and the second lead portion of the first lead unit without being connected through other portions of the lead frame; and at the other of the two short-sides of the second lead unit, the first lead portion and the second lead portion of the second lead unit are connected to a first lead portion of the third lead unit without being connected through the other portions of the lead frame.

18. The lead frame according to claim 15, wherein the lead frame includes a first lead unit, a second lead unit, and a third lead unit disposed in this order in a row direction, and at one of the two short-sides of the second lead unit, the first lead portion of the second lead unit is connected to the first lead portion and the second lead portion of the first lead unit without being connected through other portions of the lead frame; and at the other of the two short-sides of the second lead unit, the first lead portion and the second lead portion of the second lead unit are connected to a first lead portion of the third lead unit without being connected through the other portions of the lead frame.

* * * * *